(12) United States Patent
Lee et al.

(10) Patent No.: US 11,482,288 B2
(45) Date of Patent: *Oct. 25, 2022

(54) NONVOLATILE MEMORY DEVICE AND METHOD FOR OPERATING WITH VARYING PROGRAMMING TIME

(71) Applicant: Samsung Electronics Co., Ltd., Suwon-si (KR)

(72) Inventors: Seul Bee Lee, Hwaseong-si (KR); Dong Hun Kwak, Hwaseong-si (KR); Jong-Chul Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/242,712

(22) Filed: Apr. 28, 2021

(65) Prior Publication Data
US 2021/0249090 A1   Aug. 12, 2021

Related U.S. Application Data

(63) Continuation of application No. 16/407,761, filed on May 9, 2019, now Pat. No. 11,024,397.

(30) Foreign Application Priority Data

Nov. 6, 2018 (KR) .................... 10-2018-0134852

(51) Int. Cl.
    *G11C 16/34* (2006.01)
    *G11C 16/08* (2006.01)
(52) U.S. Cl.
    CPC .......... *G11C 16/3404* (2013.01); *G11C 16/08* (2013.01); *G11C 16/3459* (2013.01)

(58) Field of Classification Search
    CPC . G11C 16/3404; G11C 16/08; G11C 16/3459; G11C 16/30; G11C 16/10;
    (Continued)

(56) References Cited

U.S. PATENT DOCUMENTS 7,073,103 B2   7/2006   Gongwer et al.
7,286,400 B2   10/2007  Kojima et al.
(Continued)

FOREIGN PATENT DOCUMENTS

KR   10-0719368 B1   5/2007

*Primary Examiner* — Sultana Begum
(74) *Attorney, Agent, or Firm* — Harness, Dickey & Pierce, P.L.C.

(57) ABSTRACT

A nonvolatile memory device is provided. A nonvolatile memory device comprises a word line, a bit line, a memory cell array including a first memory cell at an intersection region between the word line and the bit line, a word line voltage generating circuitry configured to generate a program voltage, the program voltage to be provided to the word line, a row decoder circuitry configured to receive the program voltage from the word line voltage generating circuitry and configured to provide the program voltage to the word line, a verification circuitry configured to generate a verification signal in response to verifying a success or a failure of programming of the first memory cell, and a control circuitry configured to apply the program voltage to the first memory cell in response to the verification signal, and configured to cut off the program voltage in response to the verification signal.

20 Claims, 15 Drawing Sheets

(58) Field of Classification Search
CPC . G11C 16/32; G11C 16/3486; G11C 16/3481; G11C 16/24; G11C 16/3445; G11C 2211/5621; G11C 11/5628
See application file for complete search history.

(56) References Cited

U.S. PATENT DOCUMENTS

| | | |
|---|---|---|
| 7,345,928 B2 | 3/2008 | Li |
| 7,551,487 B2 | 6/2009 | Park et al. |
| 8,289,773 B2 | 10/2012 | Eguchi et al. |
| 9,053,810 B2 | 6/2015 | Dutta et al. |
| 9,455,044 B2 | 9/2016 | Joo |
| 9,842,655 B2 | 12/2017 | Kavalipurapu et al. |
| 10,014,062 B2 | 7/2018 | Moschiano et al. |
| 2005/0057995 A1 | 3/2005 | Mitani et al. |
| 2005/0248991 A1* | 11/2005 | Lee .................. G11C 16/12 365/185.28 |
| 2006/0087891 A1* | 4/2006 | Jeong ................ G11C 16/24 365/185.28 |
| 2008/0094910 A1 | 4/2008 | Sim |
| 2008/0316833 A1 | 12/2008 | Fong et al. |
| 2011/0035536 A1 | 2/2011 | Shim et al. |
| 2013/0163359 A1 | 6/2013 | Noh |
| 2019/0057751 A1* | 2/2019 | Lee .................. G11C 16/3459 |

\* cited by examiner

NONVOLATILE MEMORY DEVICE AND METHOD FOR OPERATING WITH VARYING PROGRAMMING TIME

CROSS-REFERENCE TO RELATED APPLICATION

This application is a continuation of U.S. application Ser. No. 16/407,761, filed on May 9, 2019, which claims priority from Korean Patent Application No. 10-2018-0134852 filed on Nov. 6, 2018 in the Korean Intellectual Property Office, and all the benefits accruing therefrom under 35 U.S.C. § 119, the contents of each of which in its entirety are herein incorporated by reference.

BACKGROUND

Inventive concepts relates to a nonvolatile memory device and a method for operating the same, and more specifically, to a nonvolatile memory device capable of improving a program speed and a method for operating the same.

A semiconductor memory device includes a storage device that stores data and may read the data when desired and/or necessary. The semiconductor memory device may be largely classified into a nonvolatile memory in which stored data does not disappear even when a power is not supplied, and a volatile memory (VM) in which stored data disappears when the power is no longer supplied.

A PROM (Programmable ROM), an EPROM (Erasable PROM), an EEPROM (Electrically EPROM), a flash memory, and/or the like are adopted as the nonvolatile memory. The flash memory is largely classified into a NOR flash memory and a NAND flash memory. A dynamic RAM (DRAM), a static RAM (SRAM) and/or the like are adopted as the volatile memory.

SUMMARY

Aspects of inventive concepts provide a nonvolatile memory device capable of shortening a program time.

Aspects of inventive concepts also provide a method for operating a nonvolatile memory device capable of shortening the program time.

The aspects of inventive concepts are not limited to those mentioned above and another aspect which has not been mentioned can be clearly understood by those of ordinary skill in the art from the description below.

According to some example embodiments, a nonvolatile memory device comprises a word line, a bit line, a memory cell array including a first memory cell at an intersection region between the word line and the bit line, a word line voltage generating circuitry configured to generate a program voltage, the program voltage to be provided to the word line, a row decoder circuitry configured to receive the program voltage from the word line voltage generating circuitry and configured to provide the program voltage to the word line, a verification circuitry configured to generate a verification signal in response to verifying a success or a failure of programming of the first memory cell, and a control circuitry configured to apply the program voltage to the first memory cell in response to the verification signal, and configured to cut off the program voltage in response to the verification signal.

According to some example embodiments, a nonvolatile memory device comprises a cell array including a first memory cell configured to store programmed data, a verification circuitry configured to receive the data and generate a success signal or a failure signal in response to verifying success or failure of programming of the data, and a control circuitry configured to receive the success signal or the failure signal. The programming of the data includes first and second loop programs to be sequentially executed by the nonvolatile memory device. The nonvolatile memory device is configured to execute the first and second loop programs in first and second loops, respectively. The first loop includes a gap time and a first program time, the first program time being at which the nonvolatile memory device executes the first loop program. The second loop includes a second gap time and a second program time, the second program time being a time at which the nonvolatile memory device executes the second loop program. The verification circuitry is configured to verify success or failure of the first loop program during the second program time, and is configured to generate the success signal or the failure signal. In response to receiving the success signal, the control circuitry is configured to terminate the second program time at a first time point, and in response to receiving the failure signal, the control circuitry transmits the second program time at a second time point later than the first time point.

According to some example embodiments, a nonvolatile memory system comprises a host, a nonvolatile memory device, and a memory controller which controls a program operation, a reading operation, and an erasing operation of the nonvolatile memory device. The nonvolatile memory device is configured to execute the program operation separately for each of a plurality of loops, the plurality of loops including a first loop and a second loop after the first loop. In the second loop the nonvolatile memory device is configured to verify whether program of the first loop succeeds. The nonvolatile memory device is configured to terminate the second loop at a first time point in response to the program of the first loop succeeding. The nonvolatile memory device is configured to terminate the second loop at a second time point later than the first time point in response to the program of the first loop failing.

Other features and example embodiments may be apparent from the following detailed description, the drawings, and the claims.

BRIEF DESCRIPTION OF THE DRAWINGS

The above and other aspects and features of inventive concepts will become more apparent by describing in detail example embodiments thereof with reference to the attached drawings, in which.

DETAILED DESCRIPTION OF EXAMPLE EMBODIMENTS

Figure 1:
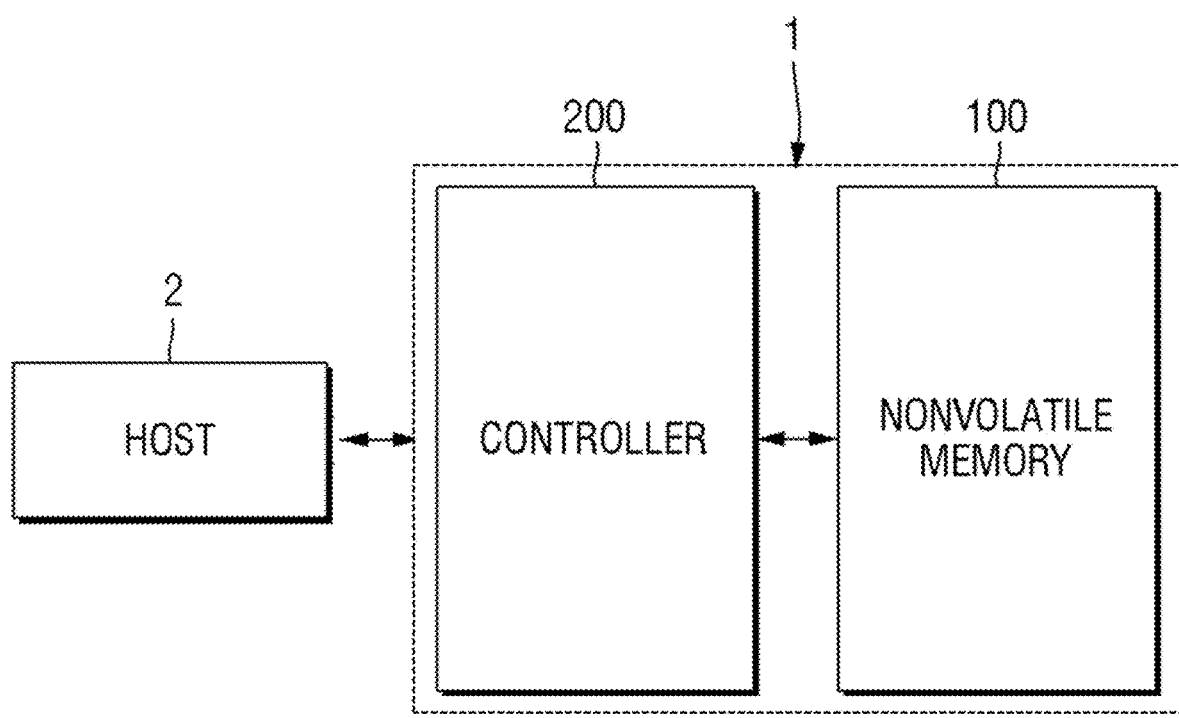
FIG. 1 is an example block diagram illustrating a storage device including a nonvolatile memory device.

As used herein, each of, or at least some of, or none of, the components of each of the figures such as FIGS. 1, 9, 11, 12, 13, 15, and 16 may be implemented as and/or include processing circuitry such as hardware, for example as hardware including at least one circuit and/or at least one combinatorial logic unit (CLU) that performs the stated functions. For example, each of, or at least some of, or none of, the host 2, the controller 200, the nonvolatile memory 100, the PGM voltage adjuster 192, the controller 194, the host interface 2230, the ECC 2240, the memory interface 2250, the control circuitry 170, the verification circuitry 160, the word line voltage generating circuitry 180, or the row decoder circuitry 120 may be implemented as or include a sequence of electrical gates, transistors, resistors, flip-flops, etc. implemented in the nonvolatile memory device 100. Furthermore, each of, or at least some of, or none of, each of the figures may include a hardware/software combination such as a processor executing software. For example, each of, or at least some of, or none of, the host 2, the controller 200, the nonvolatile memory 100, the PGM voltage adjuster 192, the controller 194, the host interface 2230, the ECC 2240, the memory interface 2250, the control circuitry 170, the verification circuitry 160, the word line voltage generating circuitry 180, or the row decoder circuitry 120 may be implemented as or include a sequence of electrical gates, transistors, resistors, flip-flops, etc. implemented in the nonvolatile memory device 100. Each of, or at least some of, or none of, the components of the figures may be integrated, as an integrated circuitry (IC), with other components of the same or other figures.

FIG. 1 is an example block diagram illustrating a storage device including a nonvolatile memory device.

Referring to FIG. 1, a storage device 1 includes a nonvolatile memory device 100 and a controller 200.

The controller 200 may be connected to a host 2 and the nonvolatile memory device 100. The controller 200 may access the nonvolatile memory device 100 in response to a request from the host 2. For example, the controller 200 may be configured to control read, program, erase, and background operations of the nonvolatile memory device 100.

The controller 200 may include an interface. The controller 200 may drive a firmware to control the nonvolatile memory device 100.

Figure 2:
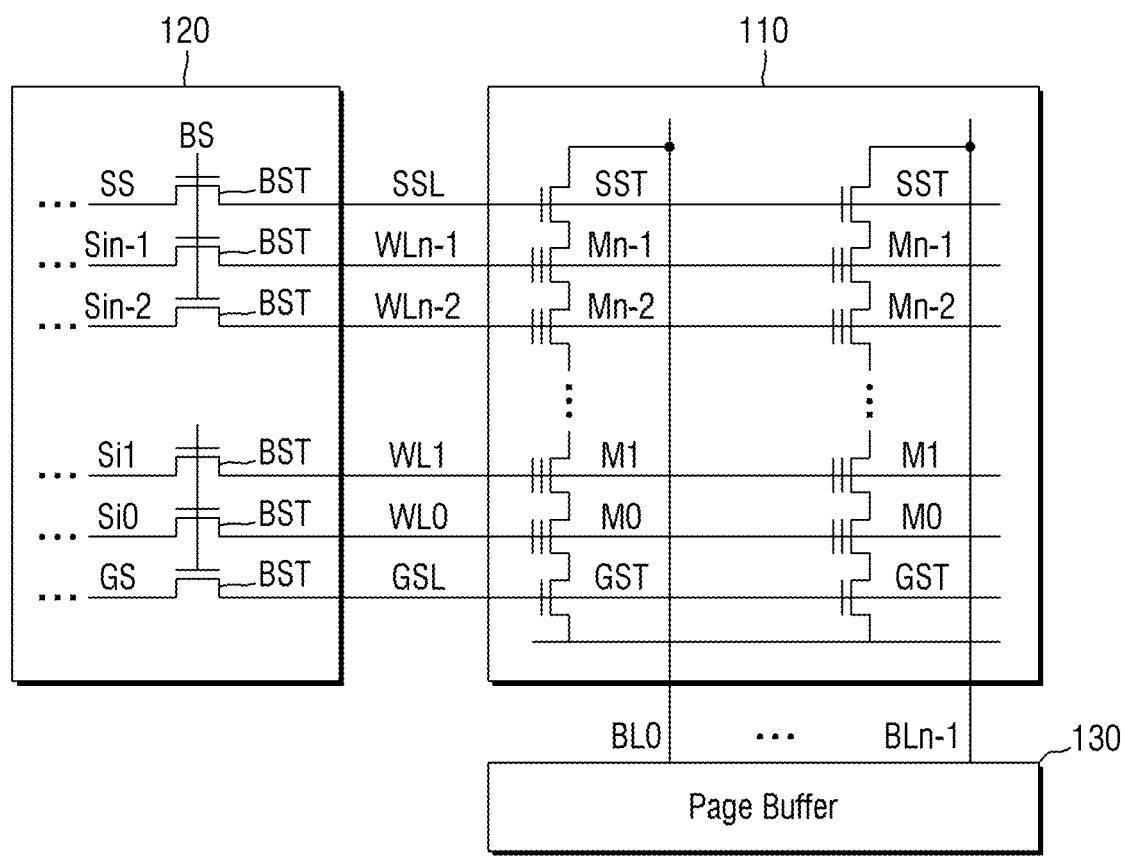
FIG. 2 is an example block diagram of the nonvolatile memory device of FIG. 1.

FIG. 2 is an example block diagram of the nonvolatile memory device of FIG. 1.

Referring to FIG. 2, the nonvolatile memory device 100 may include a memory cell array 110, a row decoder circuitry 120, and a page buffer circuitry 130. The rows of the memory cell array 110 may be driven by the row decoder circuitry 120, and columns thereof may be driven by the page buffer circuitry 130.

The memory cell array 110 may be made up of or include a plurality of memory cell blocks. The memory cell blocks may also be stacked in a three-dimensional form, e.g., without being limited to a two-dimensional form. Each memory cell block may include a plurality of memory cell strings ("NAND strings"). Each cell string may include a plurality of floating gate transistors (M0 to Mn−1) that perform functions as memory cells. Channels of the plurality of floating gate transistors (M0 to Mn−1) of each string may be connected in series between the channel of a string select transistor (SST) and the channel of a ground select transistor (GST).

Each block of the memory cell array 110 may include a string select line (SSL), a ground select line (GSL), a plurality of word lines (WL0 to WLn−1), and a plurality of bit lines (BL0 to BLn−1). The string select line may be commonly connected to gates of a plurality of string select transistor (SST). Each word line may be commonly connected to the control gates of a plurality of corresponding floating gate transistors (M0 to Mn−1). The ground select line (GSL) may be commonly connected to the gates of the plurality of ground select transistors (GST). Each bit line may be connected to a corresponding one cell string. Further, the ground select line (GSL), the plurality of word lines (WL0 to WLn−1), and the string select line (SSL) may receive the corresponding select signals (GS, Si0 to $Si_{n-1}$, and SS) through corresponding block select transistors (BST), respectively. The block select transistors (BST) may be included in the row decoder circuitry 120, and may be connected so as to be commonly controlled by the block control signal BS.

The row decoder circuitry 120 may select one word line of the plurality of word lines (WL0 to WLn−1) in accordance with the row address information. Word line voltages, e.g. appropriate word line voltages corresponding to each operation mode, may be supplied to the selected word lines and the unselected word lines. For example, the row decoder circuitry 120 may supply a program voltage to the selected word line and may supply a pass voltage to the unselected word lines at the time of a program operation mode. Alternatively or additionally, the row decoder circuitry 120 may supply the ground voltage (GND) to the selected word lines and may supply the reading voltage to the unselected word lines at the time of a reading operation mode. To this end, the selection signals (Si0 to Sin−1) may be input to the row decoder circuitry 120 from the word line driver. Alternatively or additionally, the row decoder circuitry 120 may provide the word line voltage to the word lines (WL0 to WLn−1) corresponding to the input selection signals (Si0 to Sin−1). The selection signals (Si0 to Sin−1) may have a voltage level corresponding to at least one of a program voltage, a pass voltage, and a reading voltage. Alternatively or additionally, the word line voltage may be provided to the word lines (WL0 to WLn−1) corresponding to the selection signals (Si0 to Sin−1).

The plurality of bit lines (BL0 to BLn−1) arranged on the memory cell array 110 may be connected to the page buffer circuitry 130. The page buffer circuitry 130 may provide page buffers corresponding to each of the plurality of bit lines (BL0 to BLn−1). Each page buffer may be implemented to share a pair of bit lines. The page buffer circuitry 130 may supply a power supply voltage and/or a ground voltage to the plurality of bit lines (BL0 to BLn−1) depending on the data to be programmed at the time of the program operation mode. The page buffer circuitry 130 may detect data from the selected memory cells via the plurality of bit lines (BL0 to BLn−1) at the time of the reading/verifying operation mode. Checking whether the memory cell is a programmed cell or an erased cell may be possible through the detecting operation of the page buffer circuitry 130.

Figure 3:
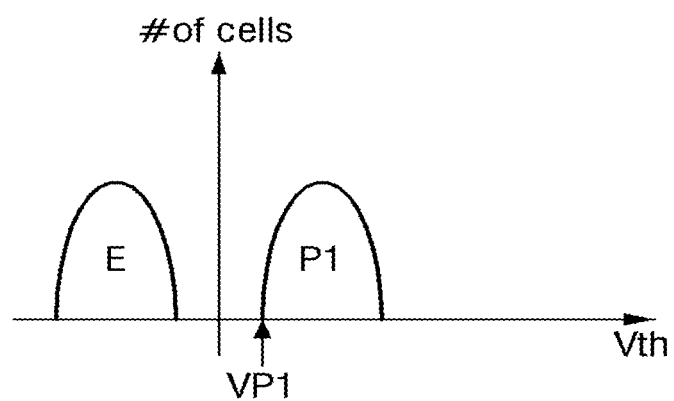
FIG. 3 is an example diagram illustrating a threshold voltage dispersion of the memory cell of FIG. 2.

FIG. 3 is an example diagram illustrating a threshold voltage dispersion of the memory cell of FIG. 2.

Referring to FIG. 3, the plurality of floating gate transistors (M0 to Mn−1) of FIG. 2 may be programmed into one of two logical states. For example, the plurality of floating gate transistors (M0 to Mn−1) may be made up of a SLC (Single Level Cell) that stores 1-bit data. An erase state E represents a state in which a plurality of floating gate transistors (M0 to Mn−1) is erased, and a first logical state P1 may represent a state in which the plurality of floating gate transistors (M0 to Mn−1) is programmed. The plurality of floating gate transistors (M0 to Mn−1) may have two threshold voltage distributions corresponding to two logical states. The logical states of the plurality of floating gate transistors (M0 to Mn−1) may be determined by the verification voltage VP1.

The voltage distribution of each logical state (E and P1) is desired to, e.g., should, maintain a thin, e.g. narrow, state, e.g. a distribution with low standard deviation. For example, an interval between a distribution of a memory cell having good operation characteristics in a threshold voltage distribution of the erase state E or a memory cell in which a threshold voltage has a large, e.g., maximum, value within a set voltage range (hereinafter referred to as a fast cell) and a distribution of a memory cell having poor operation characteristics in a threshold voltage distribution of the first logical state P1 or a memory cell in which the threshold voltage has a small, e.g., minimum value within a set voltage range (hereinafter referred to as slow cell) should be wide. For example, the interval between distributions of the respective logical states (E and P1) is desired to be, e.g., should be wide.

Furthermore, in the continuous program process, the threshold voltage distribution of the erase state E may gradually move in the direction of high threshold voltage (hereinafter an E-UPPER phenomenon). Therefore, it is desirable or necessary to reduce or minimize the time to apply the program voltage to widen the interval between distributions of respective logical states (E and P1) and to minimize the movement of the erase state E.

Figure 4:
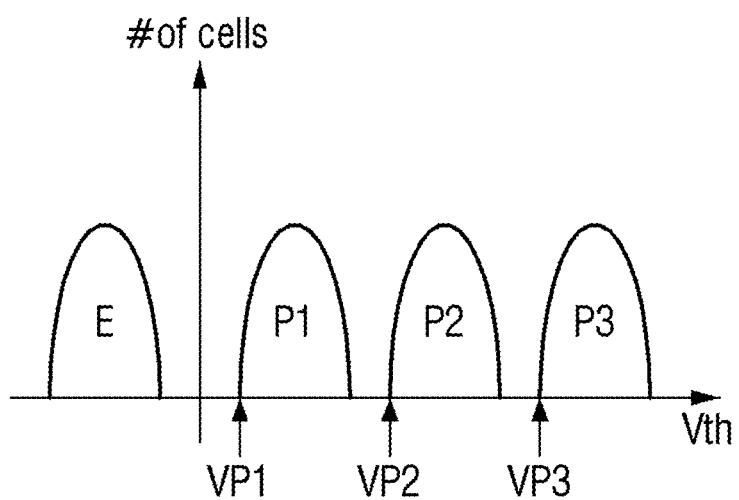
FIG. 4 is another example diagram illustrating a threshold voltage dispersion of the memory cell of FIG. 2.

FIG. 4 is another example diagram illustrating a threshold voltage dispersion of the memory cell of FIG. 2.

Referring to FIG. 4, the plurality of floating gate transistors (M0 to Mn−1) of FIG. 2 may be programmed into one of four logical states. For example, the memory cells (M0 to Mn−1) may be made up of MLC (Multi Level Cell) which stores 2-bit data. The erase state E represents a state in which a plurality of floating gate transistors (M0 to Mn−1) is erased, and the first to third logical states (P1, P2, and P3) may represent a state in which the plurality of floating gate transistors (M0 to Mn−1) is programmed. The plurality of floating gate transistors (M0 to Mn−1) may have four threshold voltage distributions corresponding to four logical states. The logical state of the plurality of floating gate transistors (M0 to Mn−1) may be discriminated by a number of verification voltages (e.g., VP1, VP2, and VP3).

The program operation of the MLC which stores 2-bit data may be sequentially executed. For example, the program operation of the least significant bit (LSB) is executed, and thereafter, the program operation of the most significant bit (MSB) may be executed.

The distribution of each of the logical states (E, P1, P2, and P3) should maintain a thin, e.g. narrow, state, e.g. a distribution with low standard deviation. For example, an interval between a distribution of a memory cell having good operation characteristics in a threshold voltage distribution of the first logical state P1 or a memory cell in which a threshold voltage has a maximum value within a set voltage range (hereinafter referred to as a fast cell) and a distribution of a memory cell having poor operation characteristics in a threshold voltage distribution of the second logical state P2 or a memory cell in which the threshold voltage has a minimum value within a set voltage range (hereinafter referred to as slow cell) should be wide. For example, the interval between the respective logical states (E, P1, P2, and P3) should be wide.

Furthermore, an E-UPPER phenomenon may occur in the continuous program process. Therefore, it is desirable or necessary to reduce minimize the time to apply program voltage to widen the interval between the respective logical states (E, P1, P2, and P3) and minimize movement of the erase state E.

Figure 5:
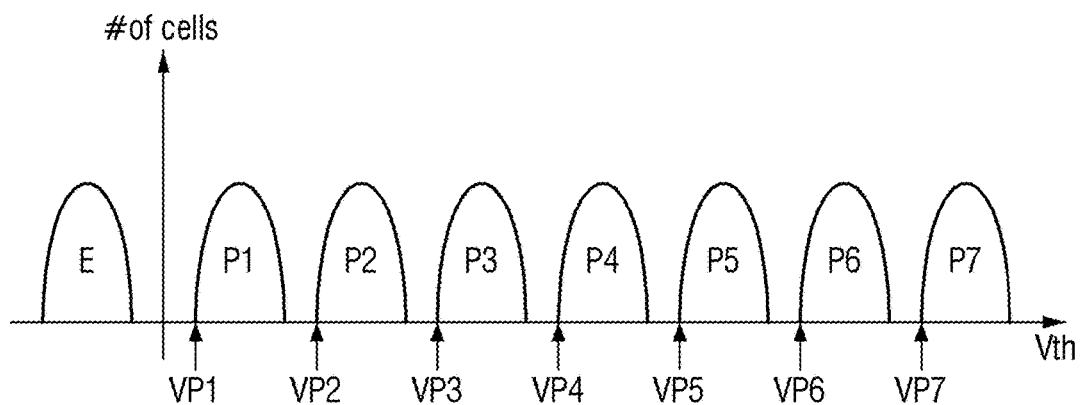
FIG. 5 is another example diagram illustrating the threshold voltage dispersion of the memory cell of FIG. 2.

FIG. 5 is another example diagram illustrating the threshold voltage dispersion of the memory cell of FIG. 2.

Referring to FIG. 5, the plurality of floating gate transistors (M0 to Mn−1) of FIG. 2 may be programmed into one of the eight logical states. For example, the plurality of floating gate transistors (M0 to Mn−1) may be made up of a TLC (Triple Level Cell) that stores 3-bit data. The erase state E represents a state in which a plurality of floating gate transistors (M0 to Mn−1) is erased, and the first to seventh logical states (P1 to P7) may represent a state in which a plurality of floating gate transistors (M0 to Mn−1) is programmed. The plurality of floating gate transistors (M0 to Mn−1) may have eight threshold voltage distributions corresponding to eight logical states. The logical states of the plurality of floating gate transistors (M0 to Mn−1) may be discriminated by a number of verification voltages (VP1 to VP7).

The program operation of the TLC that stores 3-bit data may be sequentially executed. As an example, the program operation of the least significant bit is executed, and thereafter, the program operation of the medium significant bit may be executed. Subsequently, the program operation of the most significant bit may be executed.

The threshold voltage dispersion of each logical state (E, and P1 to P7) should maintain a thin, e.g. narrow, state, e.g. a distribution with low standard deviation. For example, an interval between the distribution of the fast cell in the threshold voltage dispersion of the first logical state P1 and the distribution of the slow cell of the threshold voltage dispersion of the second logical state P2 should be wide. For example the interval between the distributions of the respective logical state (E, and P1 to P7) should be wide.

Also, an E-UPPER phenomenon may occur in the continuous program process. Therefore, it is desirable or necessary to reduce or minimize the time to apply the program voltage to widen the interval between the distributions of respective logical states (E, and P1 to P3) and minimize the movement of the erase state E.

The threshold voltage dispersions of SLC, MLC and TLC in which the plurality of floating gate transistors (M0 to Mn−1) of FIG. 2 store data are not limited thereto, and a plurality of floating gate transistors (M0 to Mn−1) of FIG. 2 may be made up of a memory cell which stores various multi-bit data.

Figure 6:
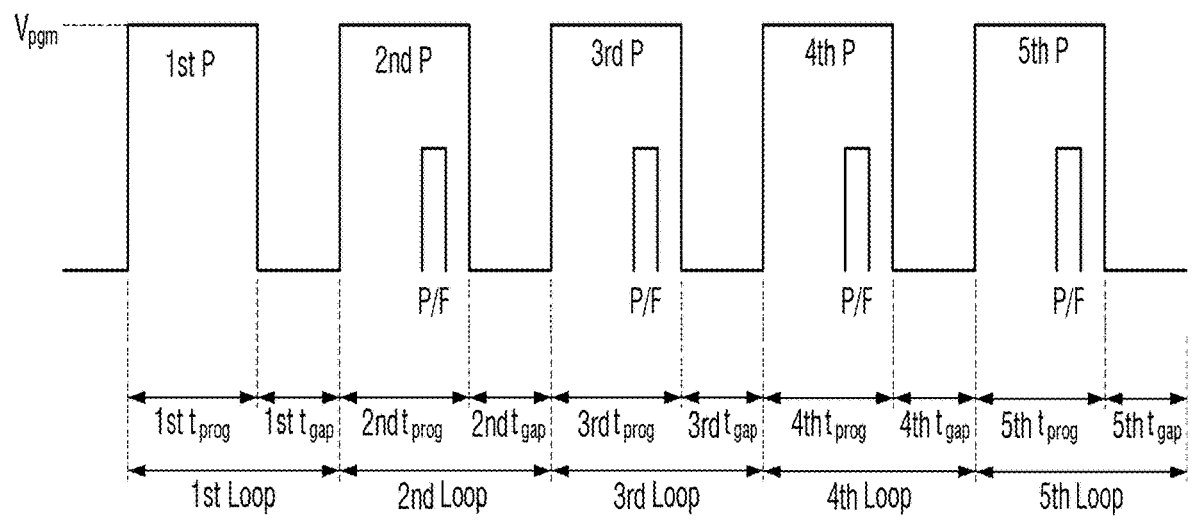
FIG. 6 is an example diagram illustrating a change in program voltage of a nonvolatile memory device.
Figure 7A:
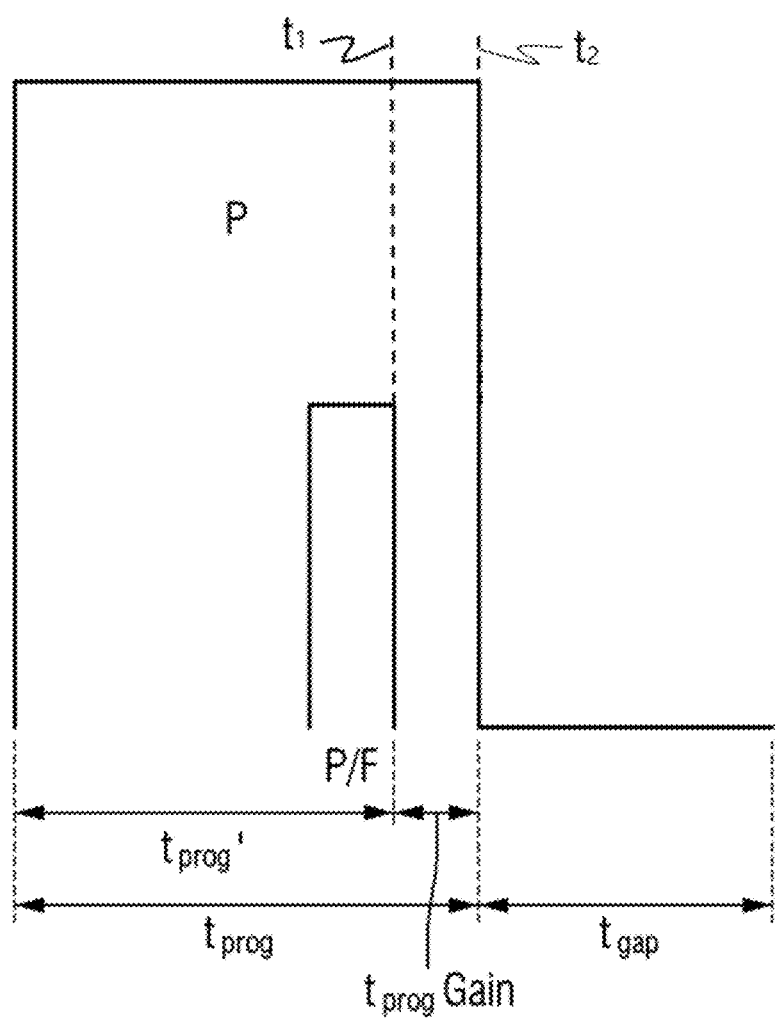
FIG. 7a is an example diagram illustrating a program voltage of the nonvolatile memory device according to some embodiments of inventive concepts.
Figure 7B:
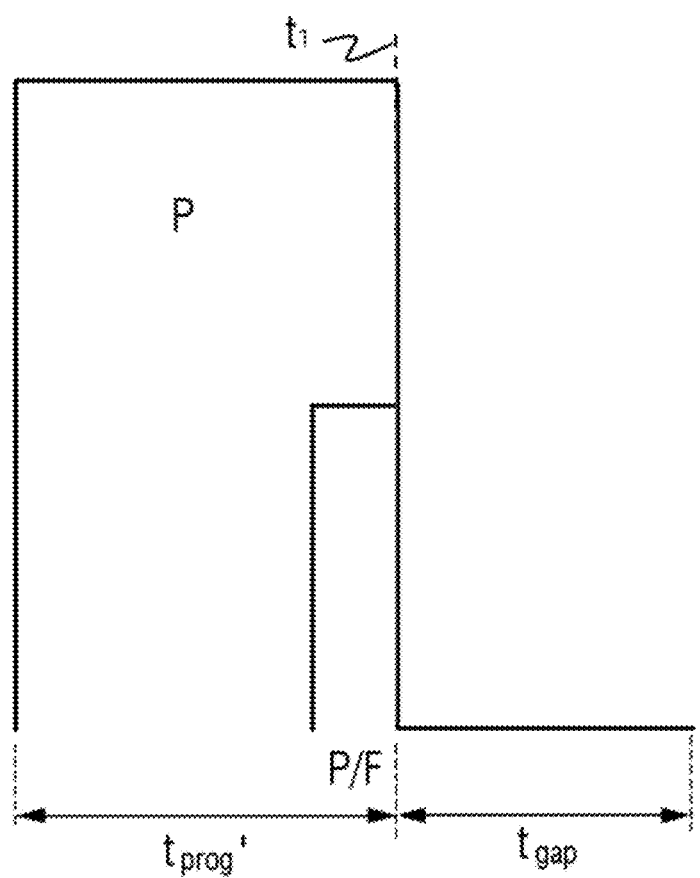
FIG. 7b is another example diagram illustrating a change in program voltage of the nonvolatile memory device according to some embodiments of inventive concepts.
Figure 8:
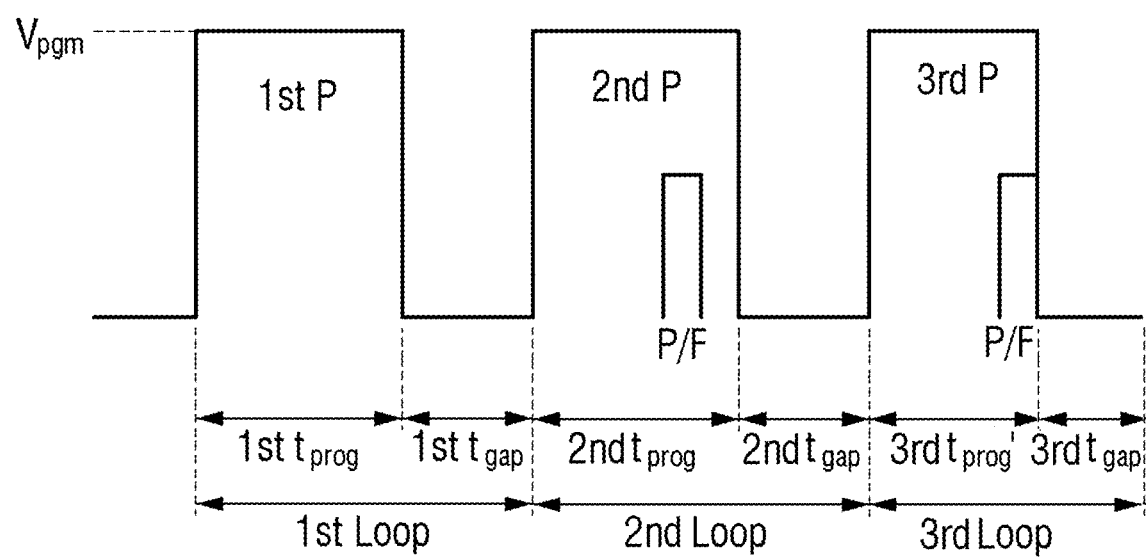
FIG. 8 is an example diagram illustrating a change in program voltage of the nonvolatile memory device according to some embodiments of inventive concepts.
Figure 9:
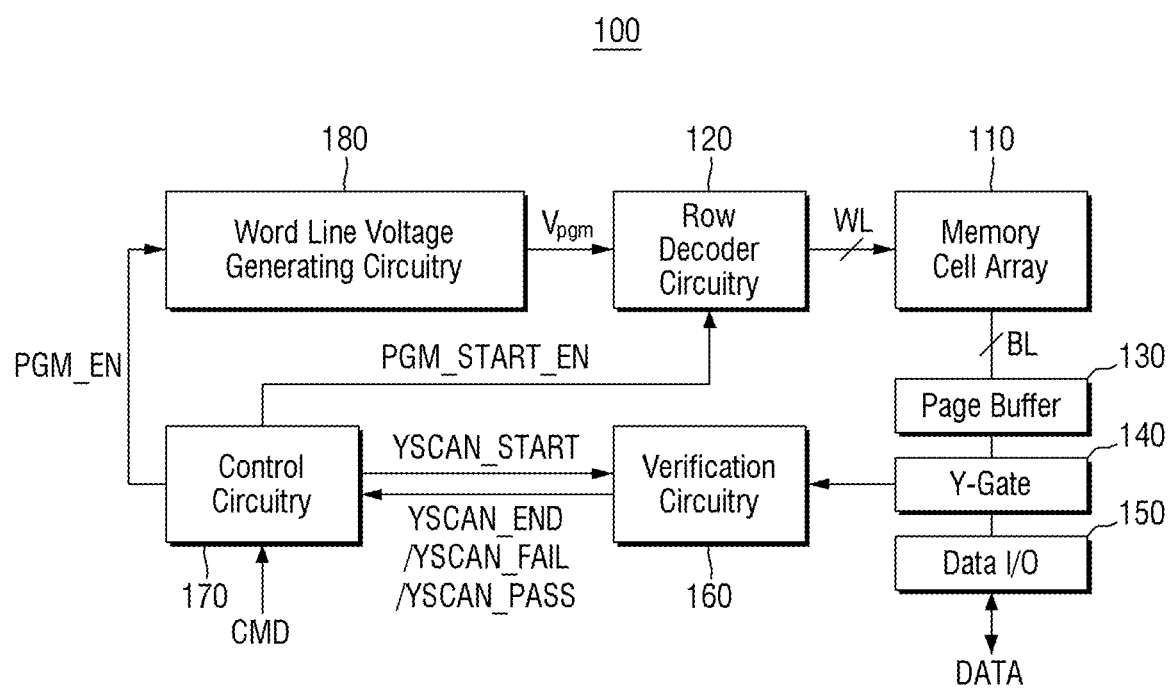
FIG. 9 is an example block diagram illustrating a nonvolatile memory device having the characteristics of FIG. 8.

FIG. 6 is an example diagram illustrating a change in program voltage of a nonvolatile memory device. FIG. 7a is an example diagram illustrating a program voltage of the nonvolatile memory device according to some embodiments of inventive concepts. FIG. 7b is another example diagram illustrating a change in program voltage of the nonvolatile memory device according to some embodiments of inventive concepts. FIG. 8 is an example diagram illustrating a change in program voltage of the nonvolatile memory device according to some embodiments of inventive concepts. FIG. 9 is an example block diagram illustrating a nonvolatile memory device having the characteristics of FIG. 8.

Referring to FIGS. 2 and 6, in order to store data in the memory cell array 110, first, a data loading command is given to the nonvolatile memory device 100, and addresses and data may be input, e.g. continuously input in the nonvolatile memory device 100. In general, the data to be programmed may be sequentially transmitted to the page buffer circuitry 130 in byte or word units. When data to be programmed, for example, all data of one page are loaded into the page buffer circuitry 130, the data stored in the page buffer circuitry 130 may be simultaneously programmed into the memory cells of the selected page of the nonvolatile memory device 100 in accordance with the program command.

A cycle at which data are programmed may be made up of a plurality of loops (1st Loop to 5th Loop). The plurality of loops (1st Loop to 5th Loop) may include loop programs (1st P to 5th P), respectively. Each of the loop programs (1st P to 5th P) may include a program verification section (P/F), except for the first loop program (1st P). Also, gap times (1st $t_{gap}$ to 5th $t_{gap}$) exist between each loop program (1st P to 5th P). A program voltage $V_{pgm}$ of a certain level may be provided to every loop programs (1st P to 5th P) for a program time (1st $t_{prog}$ to 5th $t_{prog}$).

The program verification section P/F determines whether a loop program (e.g., 1st P) of previous loop (e.g., 1st Loop) of the loop (e.g., 2nd Loop) to which the program verification section P/F belongs successfully stored in the nonvolatile memory device 100.

For example, at the program verification interval (P/F) in the second loop, determining whether the program data has been successfully programmed in the memory cell array 110 via the first loop program (1st P) in the first loop (1st Loop) may be possible. Each of the loop programs (1st P to 5th P) may be programmed for a corresponding program time (1st $t_{prog}$ to 5th $t_{prog}$) corresponding thereto. The plurality of loops (1st Loop to 5th Loop) may be repeatedly executed until all specified memory cells are programmed within a predetermined number of times.

Referring to FIGS. 2 and 7a, when the non-volatile memory determines that the program has succeeded in the previous loop, by immediately terminating the loop program at a first time point $t_1$ earlier than a second time point $t_2$, a gain time ($t_{prog}$Gain) may be obtained. For example, if the time programmed in the memory cell array 110 is reduced by the gain time ($t_{prog}$Gain), the E-UPPER phenomenon may be alleviated. Furthermore, preventing or reducing the likelihood of the interval between the threshold voltage dispersions from narrowing may be possible.

Referring to FIG. 7b, there may be a case where, when the non-volatile memory determines that the program has succeeded in the previous loop, the loop program has terminated at the first time point $t_1$.

Referring to FIG. 8, the time at which loop is repeatedly programmed may be reduced as compared to FIG. 6. Further, the program may be terminated in a loop (e.g., 5 loop) shorter, e.g. smaller and/or earlier, than the designated repetition number of times of the loop (e.g., 5 loops). As a result, it may be possible to improve the performance of the nonvolatile memory device.

A structure of the nonvolatile memory device according to some embodiments for having the operation characteristics of FIGS. 6 and 7 will be described with reference to FIG. 8.

Referring to FIGS. 8 and 9, the nonvolatile memory device 100 includes a memory cell array 110, a row decoder circuitry 120, a page buffer circuitry 130, a column gate circuitry 140, a data input/output circuitry 150, a verification circuitry 160, a control circuitry 170, and a word line voltage generating circuitry 180.

The row decoder circuitry 120 may select one of the memory blocks of the memory cell array 110 in accordance with the row address information. The word line voltage $V_{pgm}$ generated from the word line voltage generating circuitry 180 may be transferred to the selected row. The word line voltage $V_{pgm}$ may have a voltage level corresponding to at least one of a program voltage, a pass voltage, and a reading voltage. The word line voltage $V_{pgm}$ may be provided to the corresponding word line via the row decoder circuitry 120.

The page buffer circuitry 130 may include, e.g., be made up of a plurality of page buffers. The page buffer circuitry 130 may be controlled by the control circuitry 170. Each page buffer may execute a function of a detecting amplifier and a function of a writing driver in accordance with the operation mode. The data read from the page buffer circuitry 130 at the time of the reading operation may be output to the outside via a column gate circuitry 140 and a data input/output circuitry 150. The data read at the time of the verifying operation may be transmitted to the verification circuitry 160 via the column gate circuitry 140. The data to be written on the memory cell array 110 at the time of program operation may be input to the page buffer circuitry 130 via the data input/output circuitry 150 and the column gate circuitry 140. The page buffer circuitry 130 may supply a program voltage or a program inhibition voltage to corresponding columns of the bit lines in accordance with the input data.

The control circuitry 170 may control the verification circuitry 160 control circuitry 170. The verification circuitry 160 may verify whether all the selected memory cells of the page are programmed in the verification section of each loop program. The verification circuitry 160 may transmit the verified result to the control circuitry 170.

The verification circuitry 160 may execute program verification in parallel for each bit provided from each of a plurality of physical inputs/outputs constituting the memory cell array 110. For example, when 128 inputs/outputs are provided in the memory cell array 110, the verification circuitry 160 may perform the program verifying operation for a total of 128 bits provided one by one from 128 inputs/outputs in parallel. Accordingly, e.g. to this end, the verification circuitry 160 may verify whether a program error has occurred in one of the 128 bits through a logical computation (e.g., XOR computation) for a total of 128 bits each provided from 128 inputs/outputs.

The control circuitry 170 may control the at least some of, or all of, the overall program operation of the nonvolatile memory device 100. The control circuitry 170 may generate a program voltage activation signal (PGM_EN) and/or a program state activation signal (PGM_state_EN), in response to a program command (CMD) which is input via input/output fins and/or verification results (YSCAN_END, YSCAN_FAIL, and YSCAN_PASS) received from the verification circuitry.

The program voltage activation signal (PGM_EN) may be used to activate the voltage generation operation of the word line voltage generating circuitry 180. The program state activation signal (PGM_state_EN) may be used to perform or terminate a loop, in accordance with program verification results (YSCAN_END, YSCAN_FAIL, and YSCAN_PASS).

The program voltage ($V_{pgm}$) may be applied to the memory cell array 110 when the program voltage activation signal (PGM_EN) and the program state activation signal (PGM_state_EN) are activated.

The control circuitry 170 may store state information indicating whether the loop program has been normally completed. Execution of each loop may be controlled in accordance with the state information stored in the control circuitry 170. The control circuitry 170 may transmit the program voltage activation signal (PGM_EN) to the word line voltage generating circuitry 180 in response to the command (CMD) notifying the start of the program. The word line voltage generating circuitry 180 generates the program voltage ($V_{pgm}$) in response to the program voltage activation signal (PGM_EN), and may transmit the program voltage ($V_{pgm}$) to the row decoder circuitry 120. When one loop is started, the control circuitry 170 may transmit the scan start signal (YSCAN_START) to the verification circuitry 160 to verify the programmed result. The verification circuitry 160 may verify whether the memory cells connected to the selected word line have been normally programmed in response to the scan start signal (YSMAY_START).

The verification circuitry 160 may receive and receive the scan start signal (YSCAN_START) from the control circuitry 170.

The verification circuitry 160 may transmit a failure signal (YSCAN_FAIL) to the control circuitry 170 when the program is not normally or successfully programmed in the memory cells. Upon receiving the failure signal (YSCAN_FAIL) from the verification circuitry 160, the control circuitry 170 may maintain the activation of the program voltage activation signal transmitted to the word line voltage generating circuitry 180. Furthermore, the control circuitry 170 may maintain the activation of the program state activation signal (PGM_state_EN) transmitted to the row decoder circuitry 120. For example, the loop of the program voltage ($V_{pgm}$) supplied to the selected word line of the memory cell array 110 may be repeated. Furthermore, the control circuitry 170 may terminate one loop.

The verification circuitry 160 may transmit a success signal (YSCAN_PASS) to the control circuitry 170 if the program is normally, e.g. successfully, programmed in the memory cells. Upon receipt of the success signal (YSCAN_PASS) from the verification circuitry 160, the control circuitry 170 may deactivate the program voltage activation signal (PGM_EN) and/or the program state activation signal (PGM_state_EN) to be transmitted to the word line voltage generating circuitry 180. For example, the control circuitry 170 may cause the program voltage ($V_{pgm}$) not to be transmitted to the row decoder circuitry 120 from the word line voltage generating circuitry 180 or may cause the row decoder circuitry 120 to transmit the program voltage ($V_{pgm}$) to the selected word line of the memory cell array 110. Therefore, the program operation of the nonvolatile memory device 100 may be terminated regardless of the remaining program time.

After each loop is terminated, a recovery operation may be performed. The recovery operation may include an operation of returning the voltage of the bit line and the word line to a voltage specified by the user in advance, and the recovery operation is not limited thereto.

For example, by reducing the program time, the operating characteristics of the nonvolatile memory device 100 may be improved.

When all the loops of the preset number of times are executed, or when the program of the program cells is terminated by success of the program, the verification circuitry 160 may transmit the termination signal (YSCAN_END) to the control circuitry 170, regardless of whether the program succeeds. The control circuitry 170 may execute the program termination.

Figure 10:
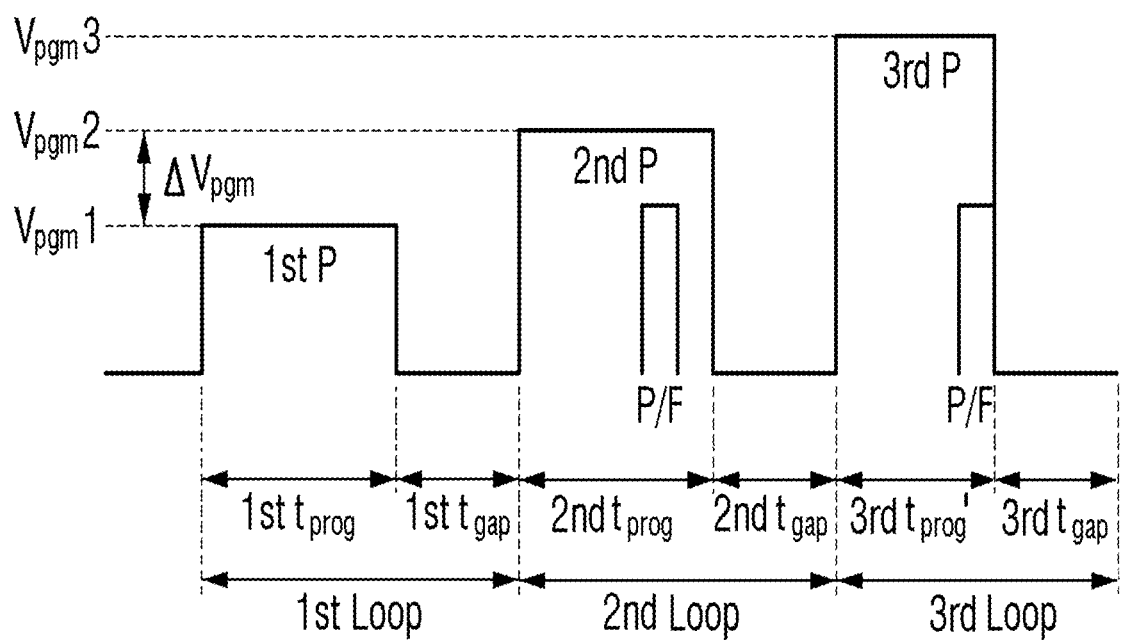
FIG. 10 is an example diagram illustrating a change in program voltage of the nonvolatile memory device according to some embodiments of inventive concepts.
Figure 11:
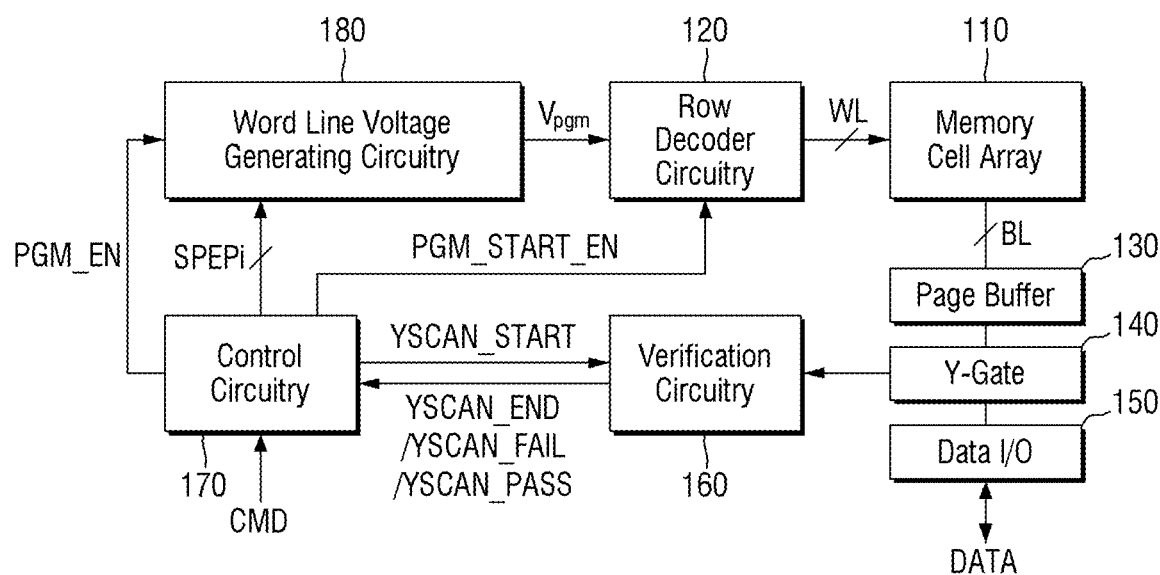
FIG. 11 is an example block diagram illustrating the nonvolatile memory device having the characteristics of FIG. 10.
Figure 12:
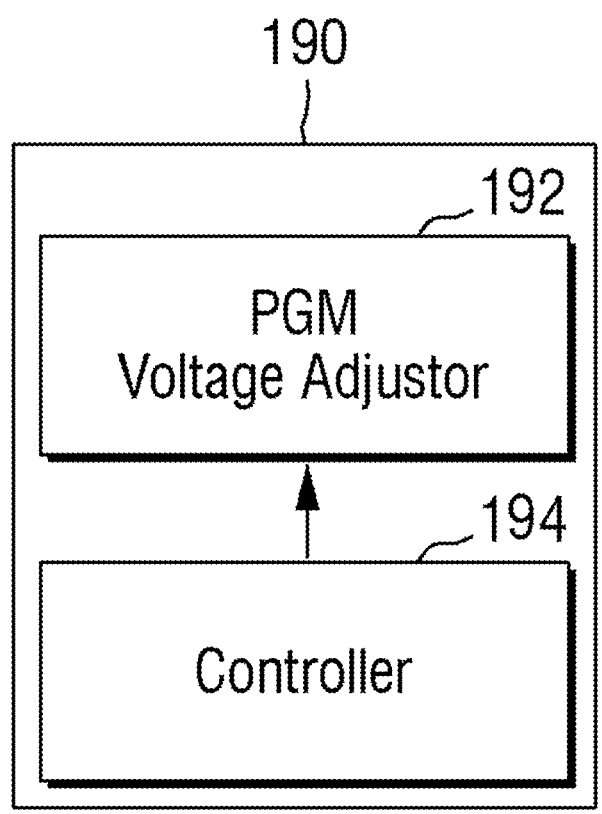
FIG. 12 is an example block diagram of the control circuitry of FIG. 11.
Figure 13:
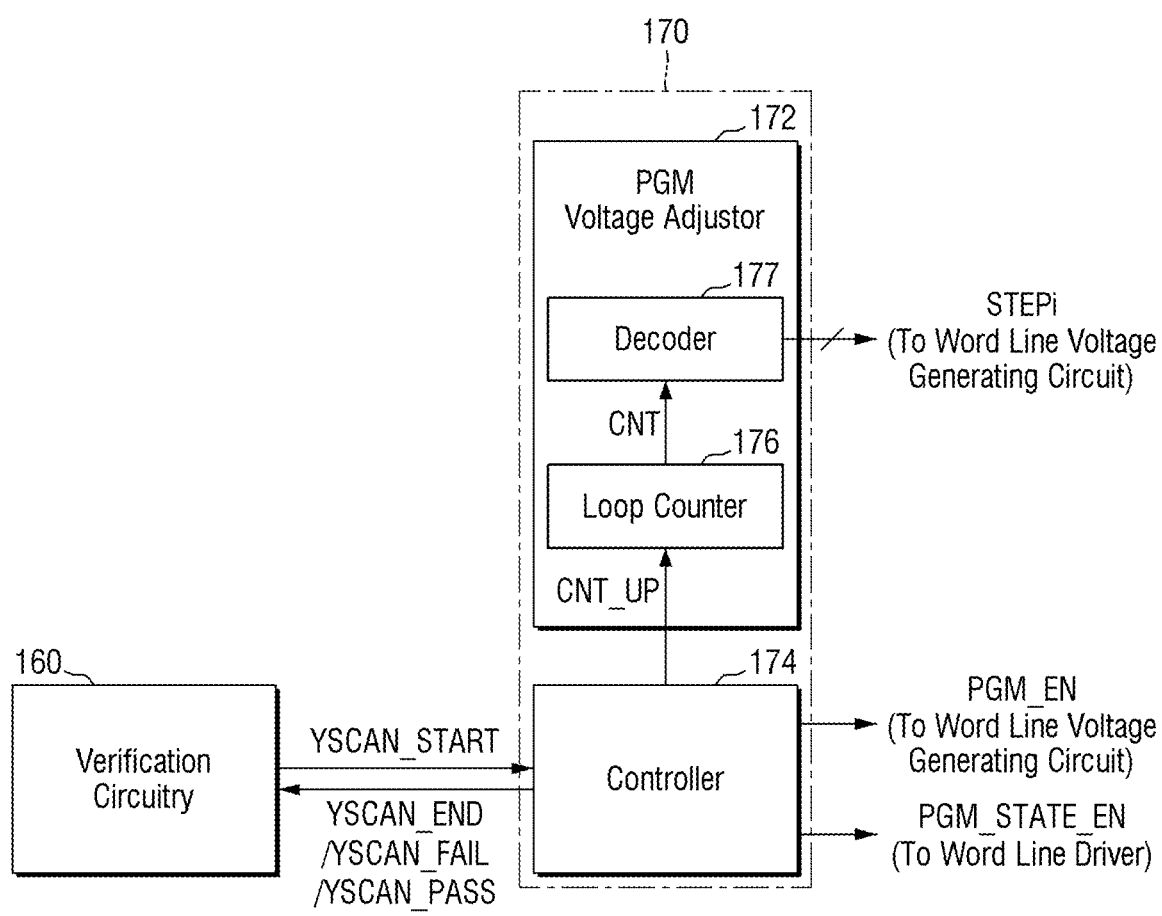
FIG. 13 is an example block diagram illustrating the operation of the control circuitry of FIG. 11.

FIG. 10 is an example diagram illustrating a change in program voltage of the nonvolatile memory device according to some embodiments of inventive concepts. FIG. 11 is an example block diagram illustrating the nonvolatile memory device having the characteristics of FIG. 10. FIG. 12 is an example block diagram of the control circuitry of FIG. 11. FIG. 13 is an example block diagram illustrating the operation of the control circuitry of FIG. 11.

Referring to FIG. 10, a program operation of the nonvolatile memory device that is programmed in accordance with an incremental step pulse program (ISPP) scheme is illustrated. Repeated explanation of the program operations of FIG. 8 will be omitted and the explanation of the incremental step pulse program method will be mainly provided.

The memory cells may be programmed in the loop program (e.g., 1st P) under given bias conditions. In the incremental step pulse program method, as the loop programs are repeated, the program voltages ($V_{pgm}1$ to $V_{pgm}5$) may be increased in stages. For example, the program voltages ($V_{pgm}2$ to $V_{pgm}5$) may be increased from the first program voltage ($V_{pgm}1$) by a defined increment ($\Delta V_{pgm}$) for each loop program. The increment ($\Delta V_{pgm}$) may not be constant for each loop program.

As in FIG. 8, the time at which the loop is repeatedly programmed may be shortened. Further, it is possible to terminate the program in a loop (e.g., 3 loop3) shorter than the designated repetition number of times of the loop (e.g., 5 loops). The E-UPPER phenomenon of the nonvolatile memory device may be alleviated accordingly. Still further, it may be possible to prevent or reduce the likelihood of the interval between the threshold voltage distributions from narrowing. Therefore, the performance of the nonvolatile memory device can be improved.

The structure of the nonvolatile memory device according to some embodiments for having the operation characteristics of FIG. 10 will be described with reference to FIG. 11. Repeated explanation of the structure and operation of FIG. 9 will be not be provided, and the incremental step pulse program method will be mainly described.

Referring to FIG. 11, the control circuitry 190 may transmit the program step code (STEPi) to the word line voltage generating circuitry 180 to provide a program voltage increment ($\Delta V_{pgm}$) to be applied for each loop. For example, the word line voltage generating circuitry 180 may supply the program voltage ($V_{pgm}$) to the row decoder circuitry 120, in response to the program voltage activation signal (PGM_EN) and the program step code (STEPi) generated from the control circuitry 190. The program voltage ($V_{pgm}$) may be gradually increased by an increment ($\Delta V_{pgm}$) during the program cycle constituted by a number of loop programs.

Referring to FIG. 12, the control circuitry 190 includes a program voltage adjustor 192 and a controller 194. The specific operation of each component will be described with reference to FIG. 13.

Referring to FIGS. 11 and 13, the program voltage adjustor 192 includes a loop counter 196 and a decoder 197. Since the operation between the controller 194 and the verification circuitry 160, the operation by which the controller 194 transmits the program voltage activation signal (PGM_EN) to the word line voltage generating circuitry 180, and the operation by which the controller 194 transmits the program state activation signal (PGM_state_EN) to the row decoder circuitry are the same as the operations of the control circuitry 170 of FIG. 8, the explanation thereof will be omitted.

Upon receiving the failure signal (YSCAN_FAIL) from the verification circuitry 160, the controller 194 may transmit a count-up signal (CNT_UP) to the loop counter 196. Upon receiving the success signal (YSCAN_PASS) or the termination signal (YSCAN_END) from the verification circuitry 160, the controller 194 may terminate the program cycle without transmitting the count-up signal (CNT_UP) to the loop counter 196.

The loop counter 196 may count the number of times of program loop and transmit the count signal (CNT) to the decoder, in response to the count-up signal (CNT_UP) generated from the controller 194. The decoder 197 may receive the count signal (CNT) from the loop counter 196, and decode the count signal (CNT) to transmit the step control signal (STEPi) (i=0 to n) to the word line voltage generating circuitry 180.

As the output value of the loop counter 196 increases, the step control signals (STEPi) (i=0 to n) may be sequentially activated. As the step control signals (STEPi) (i=0 to n) are sequentially activated, the word line voltage generating circuitry 180 may transmit the program voltage increased by the increment ($\Delta V_{pgm}$) for each loop program to the row decoder circuitry 120. The increment ($\Delta V_{pgm}$) may be adjusted depending on the user's requirements.

Figure 14:
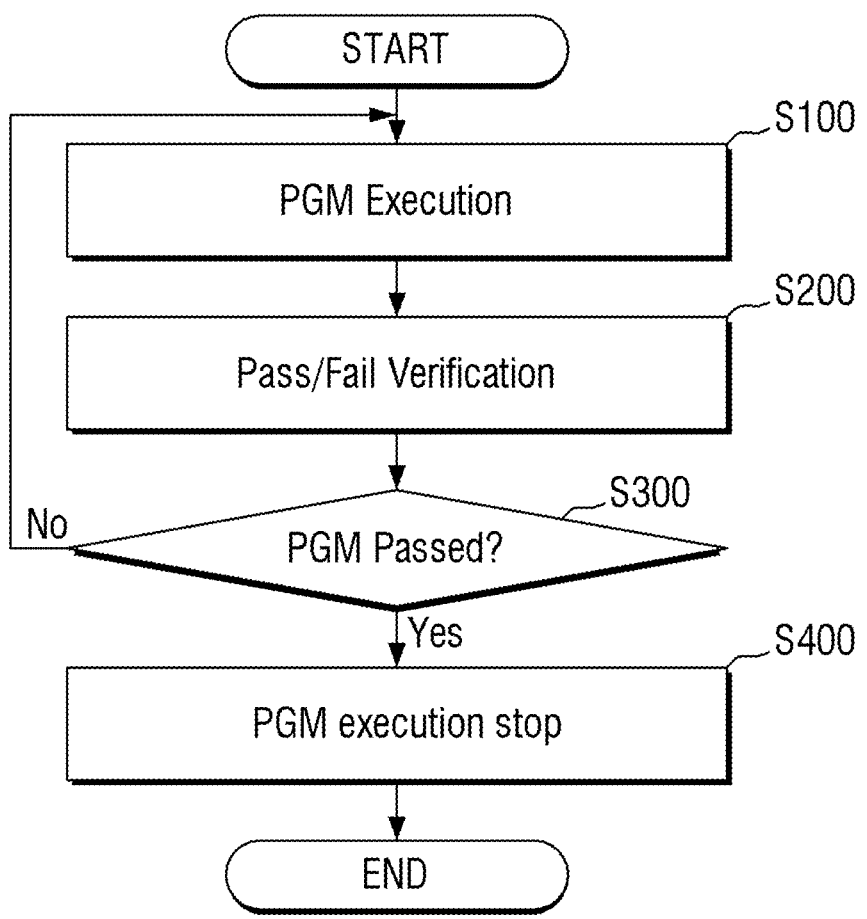
FIG. 14 is an example flowchart illustrating a method for operating the nonvolatile memory device according to some embodiments of inventive concepts.

FIG. 14 is an example flowchart illustrating a method for operating the nonvolatile memory device according to some embodiments of inventive concepts.

Referring to FIGS. 9 and 14, the word line voltage generating circuitry 180 transmits the program voltage ($V_{pgm}$) to the row decoder circuitry 120, and the row decoder circuitry 120 provides the program voltage ($V_{pgm}$) to the selected word line of the memory cell array 110. That is, a loop program is executed on the selected word line (S100).

The verification circuitry 160 verifies whether the execution of the previous loop program succeeds (S200) during the execution (S100) of the loop program.

When the control circuitry 170 receives the failure signal (YSCAN_FAIL) from the verification circuitry 160, the loop program is executed on the selected word line again (S100).

When the control circuitry 170 receives the success signal (YSCAN_PASS) from the verification circuitry 160, the driving of the nonvolatile memory device is terminated, while terminating the loop program of the selected word line (S400).

Figure 15:
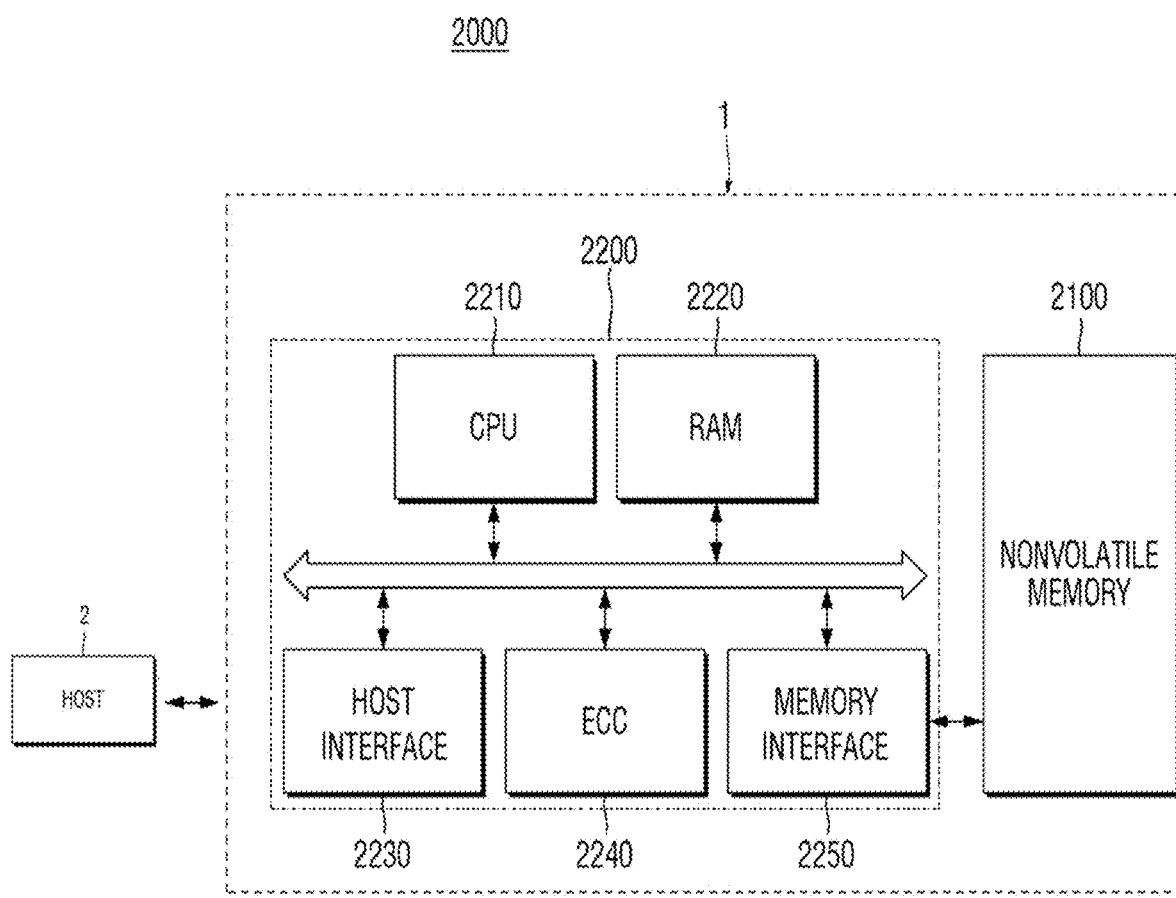
FIG. 15 is a block diagram illustrating a memory system including the nonvolatile memory device according to some embodiments of inventive concepts.

FIG. 15 is a block diagram illustrating a memory system including the nonvolatile memory device according to some embodiments of inventive concepts.

Referring to FIG. 15, the memory system 2000 may include a storage device 1 including a memory controller 2200 and a nonvolatile memory device 2100, and a host 2.

The memory controller 2200 may control the program operation, the reading operation, and the erasing operation of the nonvolatile memory device 2100 in response to the request from the host 2. The memory controller 2200 may include a CPU 2210, a RAM 2220, a host interface 2230, an error correction block 2240, and a memory interface 2250.

The CPU 2210 may control various operations of the memory controller 2200. The RAM 2220 may be used as a working memory of the CPU 2210. The host interface 2230 may interface with the host connected to the memory system 2000 to exchange data. The error correction block 2240 may detect and correct errors of data that are read from the nonvolatile memory device 2100. The memory interface 2250 may interface with the nonvolatile memory device 2100 to exchange data.

The nonvolatile memory device 2100 may also be made up of a plurality of nonvolatile memory chips. The plurality of nonvolatile memory chips may be configured and operate similarly to the nonvolatile memory device according to some embodiments of inventive concepts.

Figure 16:
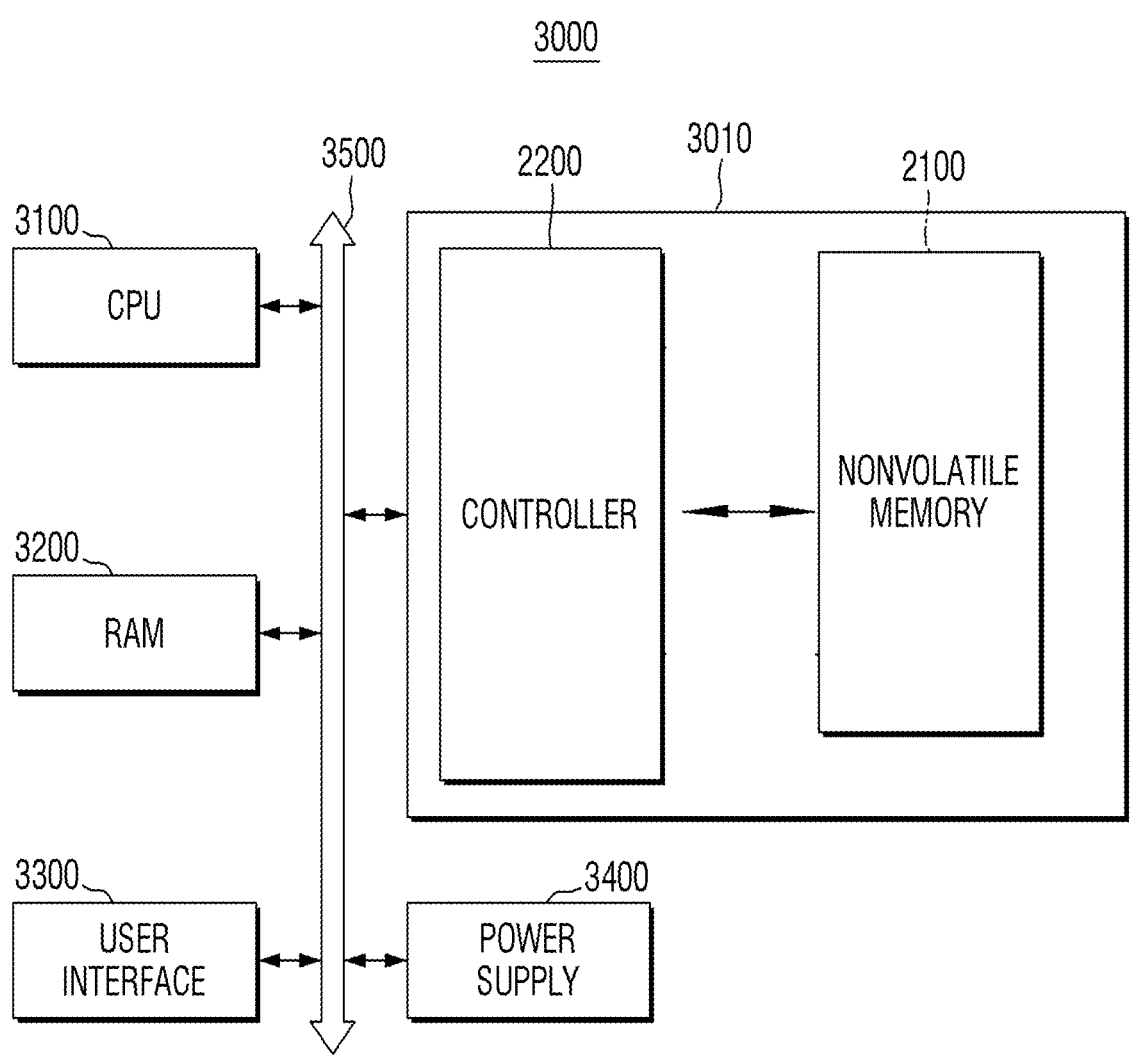
FIG. 16 is a block diagram illustrating a computing system including the nonvolatile memory device according to some embodiments of inventive concepts.

FIG. 16 is a block diagram illustrating a computing system including the nonvolatile memory device according to some embodiments of inventive concepts.

Referring to FIG. 16, the computing system 3000 may include a central processing unit 3100, a RAM 3200, a user interface 3300, a power supply 3400, and a storage device 3010.

The storage device 3010 may be electrically connected to the central processing unit 3100, the RAM 3200, the user interface 3300 and the power supply 3400 via the system bus 3500. Data provided via the user interface 3300 or data processed by the central processing unit 3100 may be stored in the storage device 3010.

The computing system 3000 may be provided as at least one of a computer, an UMPC (Ultra Mobile PC), a workstation, a net-book, a PDA (Personal Digital Assistants), a portable computer, a web tablet, a wireless phone, a mobile phone, a smart phone, an e-book, a PMP (portable multimedia player), a portable game console, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices constituting a home network, one of various electronic devices constituting a computer network, one of various electronic device constituting a telematics network, an RFID device or one of various constituent elements of the electronic devices such as one of various constituent elements constituting a computing system, but inventive concepts are not limited to such exemplification.

In concluding the detailed description, those of ordinary skill in the art will appreciate that many variations and modifications may be made to the example embodiments without substantially departing from the principles of inventive concepts. Therefore, the disclosed example embodiments of the invention are used in a generic and descriptive sense only and not for purposes of limitation.

While some example embodiments have been particularly shown and described with reference to example embodiments thereof, it will be understood by those of ordinary skill in the art that various changes in form and details may be made therein without departing from the spirit and scope of the present inventive concept as defined by the following claims. It is therefore desired that example embodiments be considered in all respects as illustrative and not restrictive, reference being made to the appended claims rather than the foregoing description to indicate the scope of the invention.

What is claimed is:

1. An operating method of a storage device including a non-volatile memory device including a first memory cell connected to a word line and a bit line, and a controller, the operating method comprising:
    transferring a program command, by the controller, to program the first memory cell to the non-volatile memory device,
    performing a first program loop operation, by the non-volatile memory device, in response to the program command, and
    performing a second program loop operation, by the non-volatile memory device, in response to the program command,
    wherein the first program loop operation includes a first program execution time applying a first program voltage to the word line,
    wherein the second program loop operation includes a second program execution time applying a second program voltage to the word line and a first verify time,
    wherein the second program execution time is shorter than the first program execution time, and
    a first verifying operation in the first verify time is performed while the second program voltage is applied to the word line.

2. The operating method of the storage device of claim 1, wherein
    the second program voltage is the same with the first program voltage.

3. The operating method of the storage device of claim 1, further comprising:
    performing a recovery operation after completing the first program loop operation,
    wherein the recovery operation includes returning voltages of the word line and the bit line to a predetermine voltage.

4. The operating method of the storage device of claim 1, wherein
    the second program voltage is larger than the first program voltage.

5. The operating method of the storage device of claim 2, further comprising:
    verifying whether the first program loop operation succeeds or not during the first verify time in the second program loop, and
    terminating the applying the second program voltage to the word line in response to a result of the verifying.

6. The operating method of the storage device of claim 5, further comprising:
    transmitting a success signal or a failure signal in accordance with the result of the verifying to the controller,
    wherein the success signal makes the second program loop operation terminate applying the second program voltage.

7. The operating method of the storage device of claim 1, further comprising:
    performing a third program loop operation, by the non-volatile memory device, in response to the program command before the performing the first program loop operation, and
    verifying whether the third program loop operation succeeds or not during a second verify time,
    wherein the first program loop operation further includes the second verify time.

8. The operating method of the storage device of claim 1, wherein
    the non-volatile memory device further includes a second memory cell connected to the word line and the bit line, the second memory cell being different from the first memory cell,
    each of the performing the first program loop operation and the second program loop operation to the first and second memory cell is in parallel.

9. A nonvolatile memory device comprising:
    a memory cell array including a first memory cell configured to be programmed in response to a program command from a controller;
    a verification circuitry configured to generate a success signal or a failure signal in response to verifying a success or a failure of program of the first memory cell; and
    a control circuitry configured to receive the success signal or the failure signal,
    wherein the program of the first memory cell includes first and second loop programs to be sequentially executed by the nonvolatile memory device,
    the nonvolatile memory device is configured to execute the first and second loop programs in first and second loops, respectively,
    the first loop includes a first gap time and a first program execution time, the first program execution time being a time at which the nonvolatile memory device executes the first loop program,
    the second loop includes a second gap time and a second program execution time, the second program execution time being a time at which the nonvolatile memory device executes the second loop program,
    the verification circuitry is configured to verify success or failure of the first loop program during the second program execution time, and is configured to generate the success signal or the failure signal, and
    the control circuitry is configured to terminate the second program execution time at a first time point in response to receiving the success signal, and the control circuitry is configured to terminate the second program execution time at a second time point later than the first time point in response to receiving the failure signal.

10. The nonvolatile memory device of claim 9, wherein the program of the first memory cell is executed by a program voltage generated in a word line voltage generating circuit and transmitted to a row decoder circuit, and
    the program voltage includes:
    a first program voltage provided by the first loop program, and
    a second program voltage provided by the second loop program.

11. The nonvolatile memory device of claim 10, wherein the second program voltage is larger than the first program voltage.

12. The nonvolatile memory device of claim 10, wherein a program voltage activation signal received from the control circuitry controls the word line voltage generating circuit, and a program state activation signal received from the control circuitry controls the row decoder circuit.

13. The nonvolatile memory device of claim 12, wherein, in response to the control circuitry receiving the success signal, the control circuitry is configured to deactivate the program voltage activation signal.

14. The nonvolatile memory device of claim 12, wherein, in response to the control circuitry receiving the success signal, the control circuitry is configured to deactivate the program state activation signal.

15. The nonvolatile memory device of claim 12, wherein, in response to the control circuitry receiving the success signal, the control circuitry is configured to deactivate the program voltage activation signal and the program state activation signal.

16. A nonvolatile memory system comprising:
a host;
a nonvolatile memory device;
a memory controller, which controls a program operation, a reading operation, and an erasing operation of the nonvolatile memory device; and
a memory interface, interfacing between the nonvolatile memory device and the memory controller,
wherein the nonvolatile memory device is configured to execute the program operation separately for each of a plurality of loops, the plurality of loops including a first loop and a second loop after the first loop,
in the second loop the nonvolatile memory device is configured to verify whether program of the first loop succeeds,
the nonvolatile memory device is configured to terminate the second loop at a first time point in response to the program of the first loop succeeding, and
the nonvolatile memory device is configured to terminate the second loop at a second time point later than the first time point in response to the program of the first loop failing.

17. The nonvolatile memory system of claim 16,
wherein the first loop includes a first gap time and a first program execution time,
the second loop includes a second gap time and a second program execution time,
the program operation is configured to executed by a program voltage,
the program voltage includes a first program voltage provided by the first loop program, and a second program voltage provided by the second loop program,
the nonvolatile memory device is configured to apply the first program voltage during the first program execution time, and is configured to cut off the first program voltage during the first gap time,
the nonvolatile memory device is configured to apply the second program voltage during the second program execution time, and is configured to cut off the second program voltage during the first gap time.

18. The nonvolatile memory system of claim 17, wherein the second program execution time is shorter than the first program execution time, when the nonvolatile memory device terminates the second loop at the first time point.

19. The nonvolatile memory system of claim 18, wherein the nonvolatile memory device is configured to verify whether program of the first loop succeeds during the second program execution time.

20. The nonvolatile memory system of claim 19, wherein the second program voltage is larger than the first program voltage.

* * * * *